(12) United States Patent
Dellmann et al.

(10) Patent No.: US 8,201,325 B2
(45) Date of Patent: Jun. 19, 2012

(54) METHOD FOR PRODUCING AN INTEGRATED DEVICE

(75) Inventors: Laurent A. Dellmann, Birmensdorf (CH); Michel Despont, Au (CH); Ute Drechsler, Rüschlikon (CH); Roland M. Guerre, Horgen (CH)

(73) Assignee: International Business Machines Corporation, Armonk, NY (US)

( * ) Notice: Subject to any disclaimer, the term of this patent is extended or adjusted under 35 U.S.C. 154(b) by 730 days.

(21) Appl. No.: 12/275,276

(22) Filed: Nov. 21, 2008

(65) Prior Publication Data

US 2009/0133914 A1    May 28, 2009

(30) Foreign Application Priority Data

Nov. 22, 2007 (EP) .................................... 07121352

(51) Int. Cl.
*H05K 3/30* (2006.01)
(52) U.S. Cl. ................ 29/832; 29/825; 29/830; 29/840; 438/107; 438/108
(58) Field of Classification Search ............. 29/825, 29/830, 832, 840; 438/107, 108
See application file for complete search history.

(56) References Cited

U.S. PATENT DOCUMENTS

| | | | |
|---|---|---|---|
| 5,293,608 A | 3/1994 | Johnson et al. | |
| 6,711,650 B1 | 3/2004 | Bohrer et al. | |
| 6,897,096 B2 * | 5/2005 | Cobbley et al. | 438/123 |
| 6,964,201 B2 * | 11/2005 | Xu et al. | 73/794 |
| 7,169,652 B2 * | 1/2007 | Kimura | 438/149 |
| 7,246,205 B2 | 7/2007 | Balakrishnan et al. | |
| 7,607,222 B2 * | 10/2009 | Kang | 29/840 |
| 7,667,338 B2 * | 2/2010 | Lin et al. | 257/787 |
| 2004/0033673 A1 * | 2/2004 | Cobbley et al. | 438/455 |
| 2006/0064518 A1 | 3/2006 | Bohrer et al. | |

* cited by examiner

*Primary Examiner* — Carl Arbes
(74) *Attorney, Agent, or Firm* — Vazken Alexanian

(57) ABSTRACT

A method for producing an integrated device. A source substrate is provided, the source substrate carrying one or more components to be attached to a receiver surface having a uneven topography. The source substrate includes a deformable layer on a surface on which the one or more components are carried. The source substrate is aligned such that said one or more components carried thereon are associated with contact areas of the receiver surface. The source substrate and the receiver surface are moved towards each other such that the one or more components are brought into contact with the contact areas wherein the deformable layer is at least partially deformed. The source substrate is removed such that the one or more of the components remain located on the contact areas of the receiver surface.

9 Claims, 5 Drawing Sheets

METHOD FOR PRODUCING AN INTEGRATED DEVICE

CROSS-REFERENCE TO RELATED APPLICATIONS

This application claims priority under 35 U.S.C. §119 from European Patent Application No. 07121352.4 filed Nov. 22, 2007, the entire contents of which are incorporated herein by reference.

BACKGROUND OF THE INVENTION

1. Field of the Invention

The present invention relates to the field of producing integrated devices by attaching one or more separately produced components on a surface of a substrate.

2. Description of the Related Art

Electronic systems are composed of logic blocks, i.e. processors and memories, as well as communication buses. A significant portion of the loss of performance in such electronic systems results from the propagation time of electrical signals in interconnections between these components. A Systems-on-Chip (SOC) approach allows a reduction of these interconnection lengths in that the components of the system are cohabited on a single substrate, preferably by integrating all the components into a single chip. Different functional components such as RF MEMS, optical MEMS, III-V circuits, SiGe circuits, and the like, usually are produced using different non-compatible process technologies such that an integration on the same substrate is complex to achieve.

Presently, the options to achieve wafer scale level integration include: first, place separate components side by side, i.e. laterally, second, is to stack the components on a main surface of a base substrate or on top of each other to achieve a vertical integration, and third, a combination of lateral and vertical integration.

A conventional technique for stacking one or more components on a device or on a substrate includes, for example, allowing for transferring components from a source substrate to a receiver surface of the receiving device or the receiving substrate by aligning the source substrate carrying the components with the receiver surface, by bringing the components of the source substrate into contact with the receiver surface, by releasing the components from the source substrate such that the components are placed on the receiver surface and by finally removing the source substrate.

One important precondition to apply such a process is that when the source substrate is aligned with the receiver surface all of the components to be placed may come into full contact with respective contact areas of the receiver surface. This substantially requires that the respective contact areas of the receiver surface, onto which the components are to be placed, and the contact surface of the components, to be brought into contact with the areas of the receiver surface, correspond to each other. Preferably, both the areas of the receiver surface and the contact surfaces of the components to be attached thereon are planar and in parallel with a lateral dimension of the receiver surface. In other words, after bringing the components of the source substrate into contact with the receiver surface, the contact surfaces of the components substantially fully abut on the respective contact areas of the receiver surface.

The stacking of a plurality of devices onto each other using a transfer technology as explained above is generally realized when the contact surface of the devices attached on the source substrate and the contact areas of the receiver surface are at a horizontal uniform level. However, the application of components at wafer scale level on receiver substrates having a non-even topography using the above process is restricted.

U.S. Pat. No. 7,071,031 discloses an arrangement in which a MEMS structure is attached to the surface of a chip by means of metal stud connected to an anchor portion of the MEMS structure.

In "CMOS compatible wafer-level microdevice-distribution technology" by R. Guerre et al., Transducers 2007 International, page 2087-2090, June 2007, a device integration method is disclosed using AFM cantilevers as a test vehicle and distributing those to receiver wafers.

U.S. Application No. 20030087476 discloses a manufacturing process for displays in which a light emitting element is transferred by peeling the element from one substrate and bonding the removed element on another substrate using a cementing layer.

In U.S. Application No. 20070164463, a pattern transfer device is disclosed for usage in optical disk manufacturing processes. The device presses a transfer die having a concavo-convex pattern against a transfer target on a substrate to transfer the concavo-convex pattern onto a surface of the transfer target.

In U.S. Application No. 2006035164, a method for the duplication of microscopic patterns from a master to a substrate is disclosed in which a replica of a topographic structure on a master is formed and transferred when needed onto a receiving substrate using one of a variety of printing or imprint techniques, and then dissolved.

In U.S. Application No. 20060180595, a wafer that comprises a plurality of dies is attached to a surface of a tape structure. A grid of grooves is formed in the wafer to separate the plurality of dies on the surface of the tape structure. A portion of the tape structure that is accessible through the grooves of the grid is caused to harden into a grid shaped structure. The grid shaped structure removably holds the plurality of dies.

U.S. Application No. 200301140001 discloses the formation of a semiconductor device that involves bonding a donor substrate to a receiving substrate via a donor mesa, and removing a bulk portion while leaving the transferred layer of the donor substrate bonded to the receiving substrate.

In the article, "Wafer-Level 3D Integration Technology Platforms for ICs and MEMS", F. Niklaus, et al., describe adhesive wafer bonding for integrating high performance transducers with electronic circuits for arrayed highly-integrated sensor and actuator components. (http://www.ee.kth.se/php/modules/publications/reports/2005/IR-EE-MST_2005_001.pdf accessed on Nov. 21, 2007.)

So far, no practical solution has been shown for transfer of components to a receiver surface having uneven topography, such as, areas on the receiver surface having different levels with respect to the lateral dimension of the receiver surface, cavities, and tilted areas.

Therefore, it is one object of the present invention to provide a method for producing integrated devices having one or more separately made components attached on a receiver surface of a receiving device or a receiving substrate wherein the components can be attached even if the receiver surface has an uneven topography.

SUMMARY OF THE PRESENT INVENTION

Accordingly, in one aspect, the present invention provides a method for producing an integrated device. A source substrate carries one or more components to be attached to a receiver surface. The receiver surface has as uneven topography. The source substrate includes a deformable layer on a surface on which the one or more components are carried. The source substrate is aligned such that the one or more components carried thereon face respective contact areas of the receiver surface. The source substrate is moved toward the receiver surface such that the one or more components are brought into contact with the respective contact areas wherein the deformable layer is deformed at least partially. The source substrate is removed such that the one or more components remain located on the respective contact areas of the receiver surface. Preferably, the receiver surface comprises the surface of a receiving substrate and the surface of a receiving device mounted on the receiving substrate.

According to another aspect of the present invention, an article used in producing an integrated device is provided including a deformable layer, and one or more components releasably attached on one surface of the deformable layer. The article may preferably include a supporting substrate attached on a surface of the deformable layer opposite to the surface on which the components are placed.

According to another aspect of the present invention, a device is provided including the above described article, a receiver surface having a topography with a main receiver surface and a contact area in at least one of a recessed area, an elevated area, and a tilted area of the receiver surface, wherein one of the components attached to the source device is brought into contact with the contact area such that the deformable layer is squeezed in at least one region.

BRIEF DESCRIPTION OF THE DRAWINGS

Embodiments of the invention will now be described, by way of example, with reference to the accompanying drawings in which.

DETAILED DESCRIPTION OF THE PREFERRED EMBODIMENTS

Figure 1:
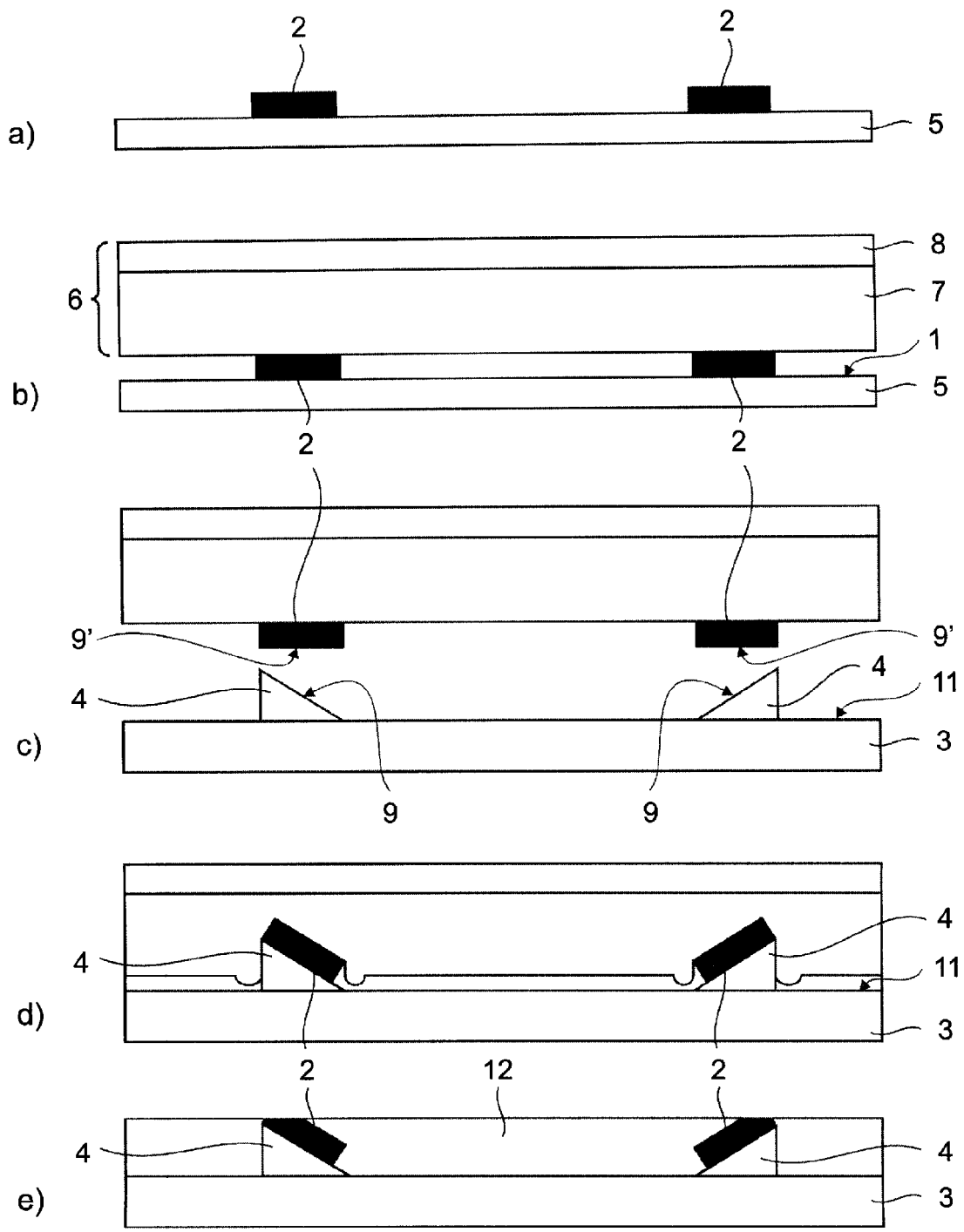
FIGS. 1a to 1e show the process steps of a method for producing an integrated device comprising a plurality of components according to an embodiment.

An underlying idea of the present invention is to provide the one or more components on a deformable layer which absorbs topography variations of a receiver surface. The deformable layer follows topographic unevenness while moving the components toward the respective contact areas on the receiver surface. Components on the source substrate are transferred to respective contact areas of a receiver substrate in that the components are allowed to fit to the level of the respective contact area and/or to the inclination of the respective contact area. Lastly, the components get attached to the respective contact area before the source substrate is removed.

In a preferred step, the one or more components are at least partially released from the deformable layer before removing the source substrate. In addition, the step of moving the source substrate toward the receiver surface such that the one or more components to be placed are brought into contact with the respective contact areas may preferably be performed by applying a pressure between the deformable layer and the receiver surface such that the deformable layer is squeezed by at least one of the one or more components. The pressure force may preferably be induced by pressing together the source substrate and a receiver substrate on which receiving devices may be mounted together.

According to another preferred embodiment, heat may be applied to at least the deformable layer while or before the step of moving the source substrate toward the receiver surface, in order to soften the deformable layer.

In yet another embodiment, the source substrate can preferably be aligned such that the components carried thereon are associated with a respective contact area on the receiver surface, wherein the contact area is recessed or elevated with respect to a main surface of the receiver surface, and/or tilted with respect to a main surface of the receiver surface. Such recessed and/or elevated and/or tilted portions of the receiver surface may preferably cause the unevenness of the receiver surface. Such portion may be caused by a device mounted on the receiving substrate.

Preferably, the source substrate carrying the components is formed with the steps of: (1) providing the components on a surface of a substrate; (2) applying an encapsulation material on the components to provide a plane surface; (3) applying deformable layer material on the plane surface; and (4) removing the substrate and the encapsulation material between or besides the components such that the components are separately attached to the deformable layer.

On a surface of the deformable layer opposing to the surface on which the components are placed, a supporting substrate may preferably be attached. Further, the components may preferably be released from the deformable layer by applying a selective laser ablation process by illuminating the contact region between the deformable layer and the respective component with laser light.

According to another embodiment, the respective contact areas may be provided with an adhesive means before the one or more components are brought into contact with the respective contact areas, wherein the respective contact areas are adapted to fixate the one or more components at least against the removing of the source substrate.

The components may preferably include at least one of a mechanical element, an electronic element, a sensor element, an actuator element, a fluidic element, an optical element and an interconnect element.

According to another aspect of the present invention, an electrical device having a coil structure fabricated with the above described method is provided wherein, as a component, a conductive layer is provided and wherein the uneven topography is formed by a protruding structure, wherein, after the component has been transferred to a surface of the protruding structure, the protruding structure is removed leaving a loop of the conductive layer extending from the receiver surface.

According to another aspect, a sensor arrangement for multidimensional measuring of electrical or magnetic fields fabricated with one of the above described methods is provided, wherein a substrate having a recessed portion having an inclined sidewall is provided, wherein as a component a field sensor is provided, and wherein at least one of the components is transferred to the inclined sidewall of the recessed portion.

The present invention can be understood easily by means of the following detailed description which is provided with reference to the attached drawings illustrating examples thereof. Embodiments of the present invention will now be described with reference to these attached drawings. Wherever possible, identical parts have been allocated identical reference symbols and duplicate descriptions thereof have been omitted.

In FIGS. 1a to 1e process states are shown illustrating an embodiment of the proposed method for producing an integrated device. The integrated device is built with a plurality of components 2 to be attached on a receiving substrate 3. The receiving substrate 3 can be a wafer made of silicon or any other suitable material. The receiving substrate 3 can be raw or can provide functional elements such as electronic elements, interconnection wiring, mechanical elements and the like, which are necessary to provide a part of the functionally of the integrated device to be produced.

The receiving substrate 3 has a receiver surface 11 with a specific uneven topography having elevated portions 4 of and protruding from the receiver surface 11 of the receiving substrate 3. The elevated portions 4 have tilted surfaces which represent contact areas 9 on which the components 2 are to be attached.

In a first step the components 2 are produced on a base substrate 5 using a suitable technology, as shown in FIG. 1a. For example, silicon electronic components can be produced using silicon technology as commonly known in the art. Further, types of components 2 include, for example, optical components, magnetic components, electro-optical components and components having micro and/or nanostructures. The base material of the components 2 is substantially arbitrary as long as it is suitable to produce the component.

After having placed the components 2 on the surface of the base substrate 5 the components 2 are transferred to a source substrate 6, as shown in FIG. 1b. This may be performed by bringing the source substrate 6 into contact with an outer surface of the components 2 on the substrate 5 such that the components 2 are attached to the source substrate 6.

The source substrate 6 may be provided with a supporting element 8 and a deformable layer 7 applied on the supporting element 8. The deformable layer 7 can be squeezed under pressure and/or heat such that the material of the deformable layer 7 is pushed away at portions where pressure is applied thereby being able to adapt its shape to a corresponding contour which is pressed on.

The deformable layer 7 can be provided as an adhesive or with an adhesive and the like such that the components 2 stick to the deformable layer 7. Thereafter, the components 2 may be released from the substrate 5 using an appropriate process as is known in the art, such as, mechanical grinding, etching and the like. As a result, the components 2 are fixed on the deformable layer 7 of the source substrate 6.

As shown in the process state of FIG. 1c, the source substrate 6 having the components 2 attached thereon are aligned with a receiver substrate 3 having a topography with tilted surfaces as contact areas 9 on elevated structures 4. The alignment is such that contact areas 9' of the components 2 are positioned facing the tilted contact areas 9 in a direction perpendicular to the lateral extension of a main surface of the receiving substrate 3 facing the source substrate 6.

As shown with the process state of FIG. 1d, the source substrate 6 is moved towards the receiver surface such that the components 2 approach the elevated structures 4 having the tilted contact areas 9. Upon applying a pressure and/or heat between the source substrate 6 and the receiver surface 11, the deformable layer 7 is squeezed (deformed) and allows the components 2 to sink into the deformable layer 7. While sinking into the deformable layer 7 the components 2 adapt their relative position to the tilted surface portions such that the components 2 themselves are pivoted with respect to the receiver surface 11. As a result, the contact surfaces 9' of the components 2 abut the tilted surfaces at the respective contact areas 9 where the components 2 are to be attached to.

The thickness of the deformable layer 7 is preferably selected according to the overall height of the step that has to be covered. Thus the thickness of the deformable layer 7 is preferably more than the overall height of the step to be covered and, preferably, should be more than 10% more of the overall height. The height of the step is preferably defined as the biggest vertical elevation of the receiver surface with respect to its main surface, or the biggest vertical recession in the receiver surface with respect to its main surface. In case of elevations and recessions both being included in the receiver surface, the height of the step determining the thickness of the deformable layer 7 preferably is determined by adding the biggest elevation and biggest recession in the receiver layer. Furthermore, the thickness of the deformable layer 7 should be selected depending on the viscosity of the deformable layer 7 at the temperature of bonding. For example, the range of thickness of the deformable layer can vary from 10 micrometer to several hundreds of micrometers which allows absorbing a wide range of topography.

During the process of moving the source substrate 6 towards the receiver surface 11 of the receiving substrate 3 (i.e. the bonding step) the material of the deformable layer 7 surrounds the protruding structures of the topography of the receiver substrate 3 such that the surface of the deformable layer 7 comes close or comes into contact with the surface of the receiving substrate 3.

Once the components 2 are brought into full abutment with the respective contact areas 9, i.e. the tilted surface of the elevated structures 4, the components 2 have to be released from the deformable layer 7 using a suitable process such as laser ablation, a heat processing, a UV release and the like. Also, the components 2 could be fixed to the respective contact areas 9 of the receiving surface which may be achieved by an adhesive applied to the contact areas 9 before bonding and/or on the contact areas 9' of the components. Alternatively, while applying heat for releasing the components 2 from the deformable layer 7 the adhesive of the contact area 9 is softened and may allow to fixate the component 2 attached thereon.

As shown in FIG. 1e, after releasing all of the components 2 or selectively releasing a part of the components 2 according to a pre-selection, the source substrate 6, including the deformable layer 7, is removed leaving the receiver substrate 3 with the components 2 attached thereon.

To ensure that the components 2 are fixed in their positions on the receiver surface 11, the respective contact areas 9 or the contact areas 9' might be provided with an adhesive and the like to fixate the components 2 thereon. In particular, during the process of removing the source substrate 6 with the deformable layer 7 it should be ensured that the removing of the source substrate 6 does not replace or remove the components 2 already placed on the respective contact areas 9 since the removing of the receiver substrate 3 may apply a sticking force to the components 2. After removing the deformable layer 7, the components 2 are attached on the tilted surfaces of the elevated structures 4 such that the components 2 are also tilted with respect to the extension of the receiver surface 11.

As further shown in process state of FIG. 1e, the cavities between the elevated structures 4 can be filled with a suitable filling material 12 and the upper surface produced thereby can be planarized, e.g. by grinding, such that an outer surface of the tilted components 2 and the outer surface of the filling material 12 are flush.

The above method can, for example, be used for producing a tape planar head, the components 2 then include magnetic sensors. Such a planar head as a magnetic head for reading and/or writing in a mass storage equipment has advantages as the above described design may allow fabrication of an array of such sensors for parallel operation and/or simplify fabrication testing.

The method described in conjunction with FIGS. 1a to 1e can be similarly applied to situations shown in FIGS. 2a to 2b, FIGS. 3a to 3b, and FIGS. 4a to 4b which differ from each other with respect to the topography of the receiver surface 11 of the receiving substrate 3.

Figure 2:
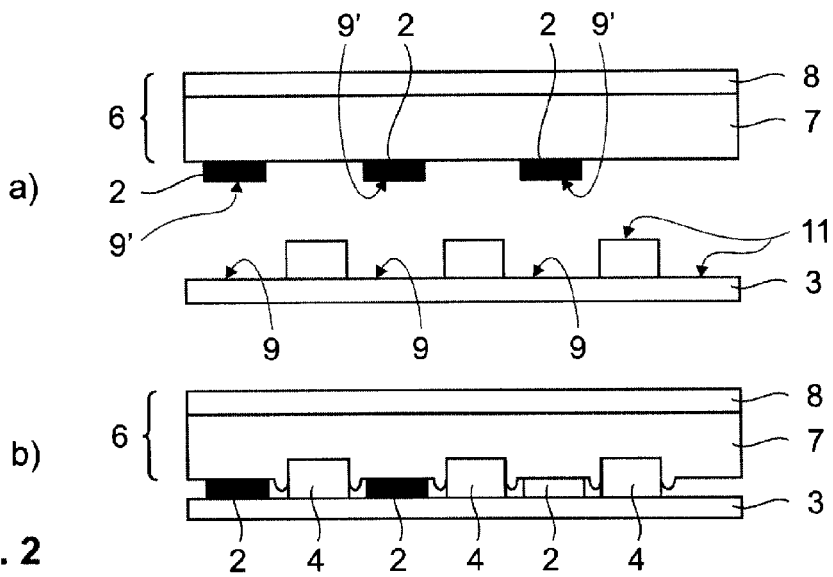
FIGS. 2a and 2b show process states of the method for producing an integrated device wherein components are attached into cavities on a receiver surface before and after the transfer, respectively.

FIGS. 2a and 2b show process states before and after the source substrate 6 and the receiver substrate 3 are brought into contact such that the contact areas 9' of the components 2 associated with the source substrate 6 come into contact with respective contact areas 9 of the receiver surface 11 where the components 2 are to be attached to. FIGS. 2a and 2b illustrate the situation wherein components 2 are to be positioned on contact areas 9 located within cavities of the receiver surface 11 formed between the elevated structures 4. The cavities have a greater depth than the thickness of the components 2 to be attached therein such that the surface portions of the deformable layer 7, rather than the components 2, come into contact with the elevated structures 4 before the components 2 contact their respective contact areas 9. Due to the capability of the deformable layer 7 to be squeezed, the elevated structures 4 which form the cavity penetrate the material of the deformable layer 7 thereby allowing that the components 2 can be easily brought into contact with the respective contact areas 9.

Figure 3:
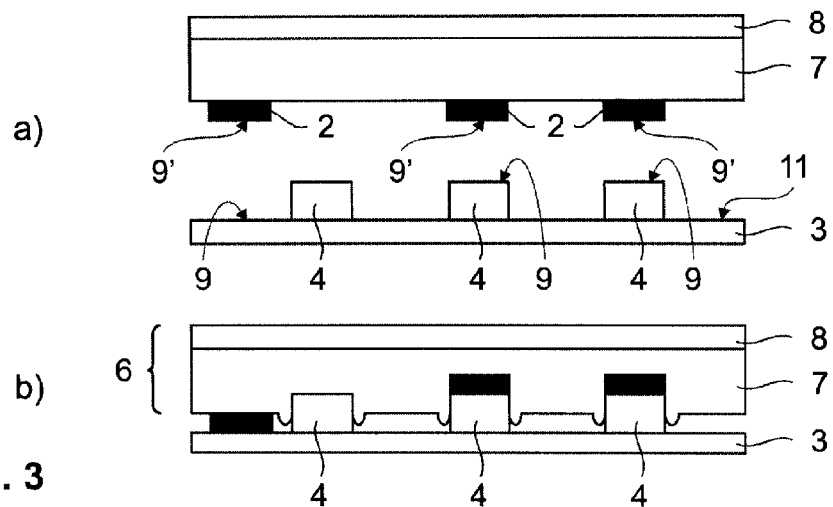
FIGS. 3a and 3b show process states of the method for producing an integrated device wherein components are attached on surfaces of different levels of a receiver surface before and after the transfer, respectively.

FIGS. 3a to 3b show process states before and after the source substrate 6 and the receiver substrate 3 are brought into contact such that the contact areas 9' of the components 2 associated with the source substrate 6 come into contact with respective contact areas 9 of the receiver surface 11 to where the components 2 are to be attached. FIGS. 3a to 3b show another example where the components 2 shall be positioned on contact areas 9 arranged on different levels on the receiving substrate 3. While components 2 to be attached to elevated contact areas 9 squeeze the deformable layer 7, other components are allowed to come into contact with less elevated contact areas 9.

Figure 4:
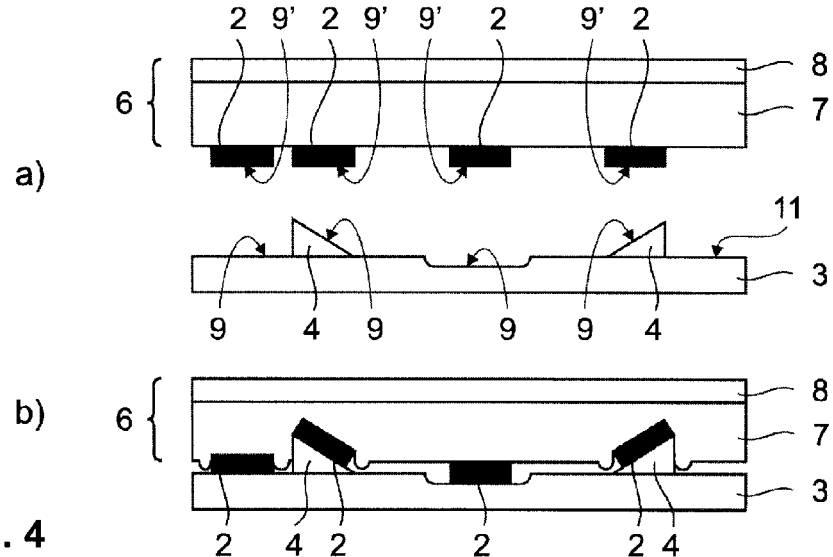
FIGS. 4a and 4b show process states of the method for producing an integrated device having components attached on surfaces of different levels and on tilted surfaces on a receiver substrate before and after the transfer, respectively.

FIGS. 4a to 4b show process states before and after the source substrate 6 and the receiver substrate 3 are brought into contact such that the contact areas 9' of the components 2 associated with the source substrate 6 come into contact with respective contact areas 9 of the receiver surface 11. FIGS. 4a to 4b show another example for applying the above method to attach components from a source substrate 6 to a receiving substrate 3 having tilted contact areas 9 and contact areas 9 having different levels. As can be seen in FIG. 4b, components 2 can be placed on the different contact areas 9 of the receiving substrate 3 since the deformable layer 7 can be squeezed to surround any elevated structure and/or any component 2 and to allow the component(s) to be attached to tilted contact area(s) to incline.

Note that in all these embodiments the receiving surface 11 represents an uneven surface due to the structures 4 on the receiving substrate 3. The main surface of the receiving surface 11 is considered to be the surface of the receiving substrate 3 itself, while the elevation structures 4 and the receiving substrate 3 in combination form the receiving surface 11 which faces the source substrate 6 including the components 2 on the source substrate 6.

To further specify the process steps of the above described process of producing an integrated device an embodiment is described in more detail. In the described example, the integrated device to be formed is a MEMS device (MEMS: microelectromechanical system). In FIGS. 5a to 5k, process states are shown which illustrate the detailed process of producing the MEMS device.

Figure 5:
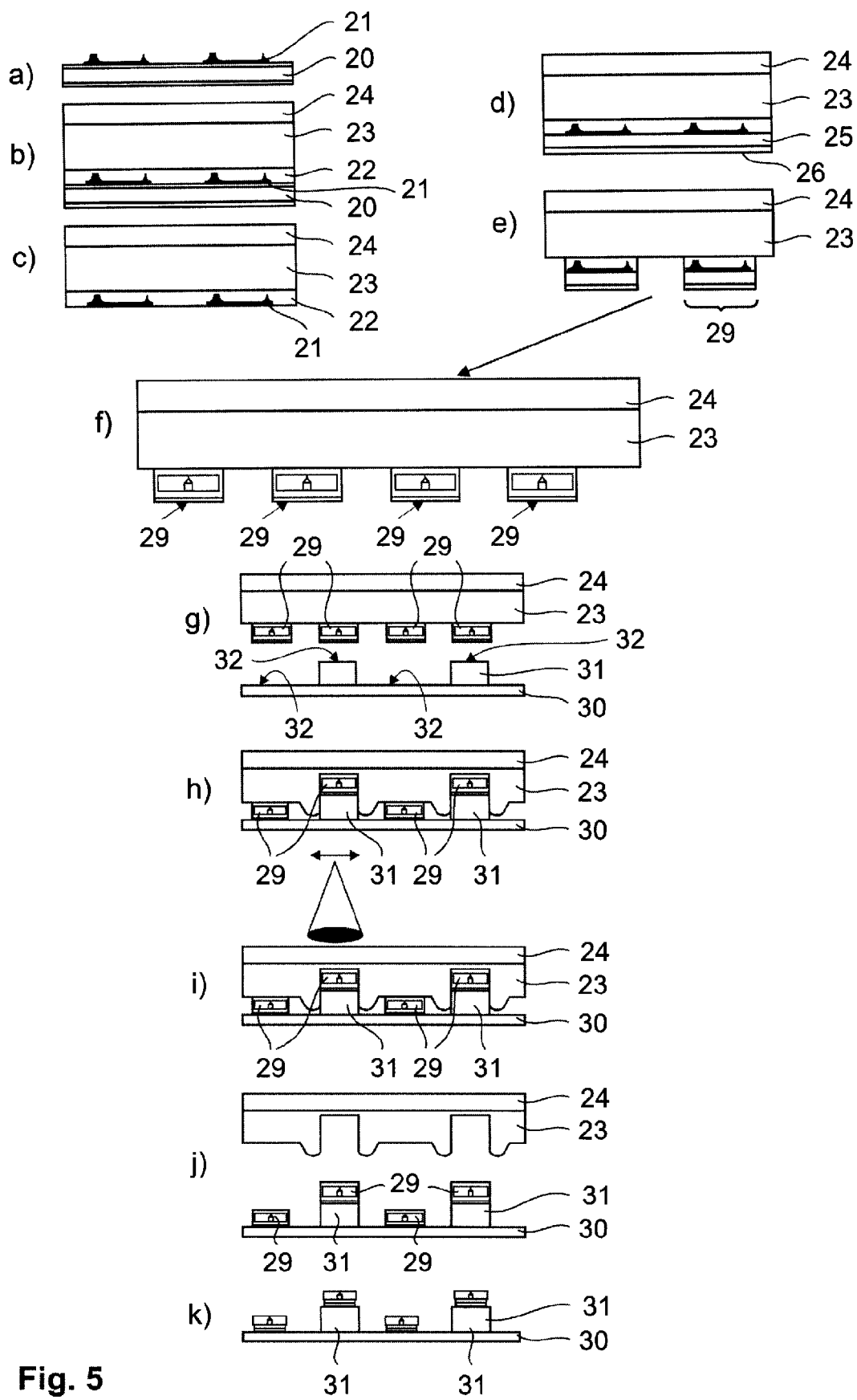
FIGS. 5a to 5k show the process states in detail producing an integrated MEMS device using the method according to an embodiment of the present invention.

In a first step, as shown in FIG. 5a, the mechanical structures 21 of the device to be produced are fabricated on a base wafer 20 (base substrate) using well-known processes. In the shown embodiment, cantilevers 21 are formed as mechanical structures. Possible mechanical structures can be formed in silicon using well-known silicon micro-technology.

Thereafter, as it is shown in the process state of FIG. 5b, a first polyimide (PI) layer 22 is spun onto the surface of the substrate 20 in order to planarize the surface and encapsulate the mechanical structures 21. A Perfluor-Alkoxyalkan (PFA) layer 23 is then deposited on top of the first PI layer 22. On top of the PFA layer a supporting substrate 24 is arranged. The supporting substrate 24 may be provided as a transparent glass wafer. For example, by using a temperature of 350° C. and a pressure of 2 bars the sandwich of the glass wafer and the base wafer 20 is bonded.

As shown in the process state of FIG. 5c, the base wafer 20 which has been used to fabricate the mechanical structures 21 thereon is removed in an appropriate process, for example, by grinding and dry etching (RIE). This process step gives access to the backside of the mechanical structures 21.

As shown in FIG. 5d, a second polyimide (PI) layer 25 is spun on the backside of the mechanical structures 21 and is cured thereafter. Further, an adhesive PI layer 26 with a lower glass transition temperature than the second PI layer 25 is spun above this second PI layer 25 and cured. The adhesive PI layer 26 will allow the components to be formed to adhere to a receiver substrate 30 later.

FIG. 5e shows a process state after a photolithography step followed by the PI dry etch using $O_2$ plasma is performed in order to selectively remove portions of the first and second PI layer 25 that rigidly holds each component with each other. As a result of this process separated MEMS components 29 are produced on the PFA layer 23 which then can be deformed and may follow the topography during a later bonding process. In FIG. 5f the obtained substrate carrying the produced MEMS components 29 is shown in a front view.

As it is illustrated in FIG. 5g, the substrate carrying the components 29 is aligned with a receiver substrate 30 having a specific topography formed by elevated structures 31 protruding from the main surface of the receiver substrate 30. On top of the elevated structures 31 elevated surface areas are contact areas 32 to accommodate respective components 29. The substrate carrying the components 29 is aligned to the receiver substrate 30 such that at least some of the components 29 are associated with the respective surface areas on top of the elevated structures 31 as contact areas 32. Other components 29 are associated with surface areas of the receiver substrate 30 as contact areas 32 which are located between or besides the elevated structures 31.

As shown in the process state of FIG. 5h, the substrate carrying the components 29 is pushed (moved) towards the receiver substrate 30 and thereby brought into close contact with the receiver substrate 30. The process of bonding is performed at a temperature of 400° C. and under a pressure of 2 bars. Due to the temperature the PFA layer 23 is softened to achieve a deformable texture. Due to the pressure (movement) the PFA layer 23 is squeezed and pushed away by the components 29 contacting the contact areas on the elevated structures. The PFA material is deformed such that it may surround each component 29 and elevated structure 31 pressed into it. Thereby, the accommodating PFA material helps that other components 29 may be transferred to contact areas 32 at a lower level than the level of the contact areas 32 on the elevated structure on the receiver substrate 30 and to come into contact with these lower contact areas 32.

As a next step the components 29 are released. For example, as shown in the process states of FIG. 5i and FIG. 5j, when using of a glass wafer 24 the component 29 can be released from the PFA layer 23 using a laser ablation process to selectively ablate the first PI layer 22 such that the substrate carrying the components 29 can be removed from the receiver substrate 30 leaving only those components 29 selected by the laser ablation of the first PI layer 22 attached on the receiver substrate 30 either on the lower contact areas of the receiver substrate 30 or on the contact areas on the elevated structures 31.

The contact areas of the receiver substrate 32 and the contact areas of the components 29 might be prepared with a kind of adhesive or other measure before bonding the substrate carrying the components 29 such that the components 29 can be securely attached to the respective contact areas during the process of the bonding. Therefore, when removing the substrate carrying the components 29 the components 29 securely remain attached on the receiver surface.

As shown in the process state of FIG. 5h, the structures remaining on the receiver substrate 30 may be cleaned in an oxygen plasma step and the cantilevers may be released from the encapsulating PI material.

Instead of PFA, other materials can be selected to form the deformable layer 7, 23. An essential characteristic of the deformable layer material is that it can be deformed under pressure, either while applying heat or not depending on the selected deformable material, such that level differences of the receiver substrate 30 between neighbored surface areas are adjusted to adapt an area carrying a component, an elevated area and a recessed area. It is preferred that the deformation occurs such that the deformable layer 7, 23 smoothly adapts to the topography provided by the topography of the receiver substrate 30 and the components 2, 29 to be attached thereon.

Figure 6:
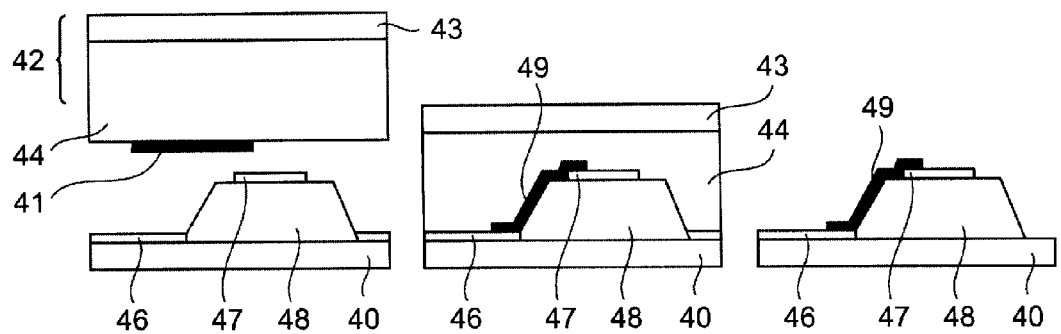
FIGS. 6a to 6c show process states for producing an electrical interconnect on a substrate having a topography wherein contacts to be connected are on different levels.

According to a further embodiment of the present invention, the method for producing a device can also be applied to provide a material layer, such as a metallic layer portion 41 for an electrical interconnection, onto a surface of a receiver substrate 40 having an uneven topography. Process states of such a method are shown in FIGS. 6a to 6c. On a source substrate 42, comprising a supporting substrate 43 and a deformable layer 44, the metallic layer portion 41 is carried which shall form an interconnection line. The metallization is to be applied on the receiver substrate 40 having an uneven topography with a protruding structure 48 such that a first contact area 46 is located on a lower level of the receiver substrate 40 and a second contact area 47 is located at an elevated level of the receiver substrate 40.

Preferably, the edge of the protruding structure 48 carrying the elevated surface area is not too steep and has an inclination which prevents a break of the interconnection line of the source substrate 42 due to mechanical stress while bonding. By bonding the source substrate 42 to the receiver substrate 40 the metallic layer portion 41 is partially pressed onto an area of the edge of the protruding structure 48 of the receiver substrate 40. Thereby, the metallic layer portion 41 deforms caused by the pressure obliged by the deforming deformable layer material 44. The metallic layer portion 41 and the deformable layer 44 are deformed during the transfer to accommodate the topography step of the protruding structure 48.

As it is shown in the process state of FIG. 6b the so formed interconnection line 49 contacts the first contact area 46 at the lower level of the receiver substrate 40 and the second contact area 47 on the elevated surface, thereby producing an electrical interconnection between the contact areas 46, 47.

The contact areas and/or the edge region of the protruding structure 48 might be prepared with a kind of adhesive or other measure before bonding which allows the metallic layer portion 41 to be securely attached to the contact areas 46, 47 and to the edge region of the protruding structure 48 during the process of the bonding such that when removing the source substrate 42, including the deformable layer 44, the interconnection line securely remains attached on the receiver substrate 40, as shown in FIG. 6c.

Figure 7:
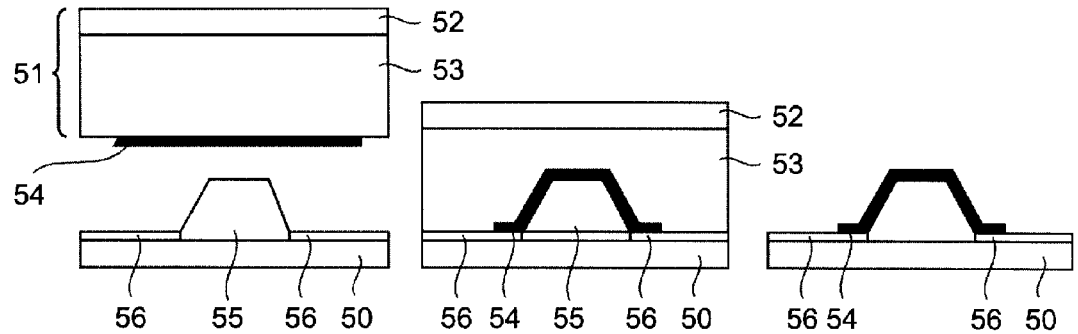
FIGS. 7a to 7c show process states of the method according to a further embodiment for producing a coil structure on a substrate.

In FIGS. 7a to 7c process states of a process for forming coils on a receiver substrate 50 are depicted. 3D coils can be realized based on a same process as described with reference to FIGS. 6a to 6c showing the formation of electrical interconnections on a receiver substrate 40 having uneven topography. The process state of FIG. 7a shows that a source substrate 51, having a supporting substrate 52, and a deformable layer 53 with an metallic layer portion 54 attached thereon, is brought into alignment with the receiver substrate 50 whereon an elevated structure 55 and contact areas 56 are located. As shown in FIG. 7b, in a bonding process the source substrate 51 and the receiver substrate 50 are bonded such that the metallic layer portion 54 is pressed onto the elevated structure 55 and the deformable layer 53 is deformed such that the metallic layer portion 54 accommodates the elevated structure 55.

As shown in FIG. 7c, after removing the source substrate 51 with the deformable layer 53, the elevated structure 55 is removed, for example, by an etching process such that the accommodated metallic layer portion 54 remains on the surface of the receiver substrate 50 protruding from the surface forming one winding of a coil.

Figure 8:
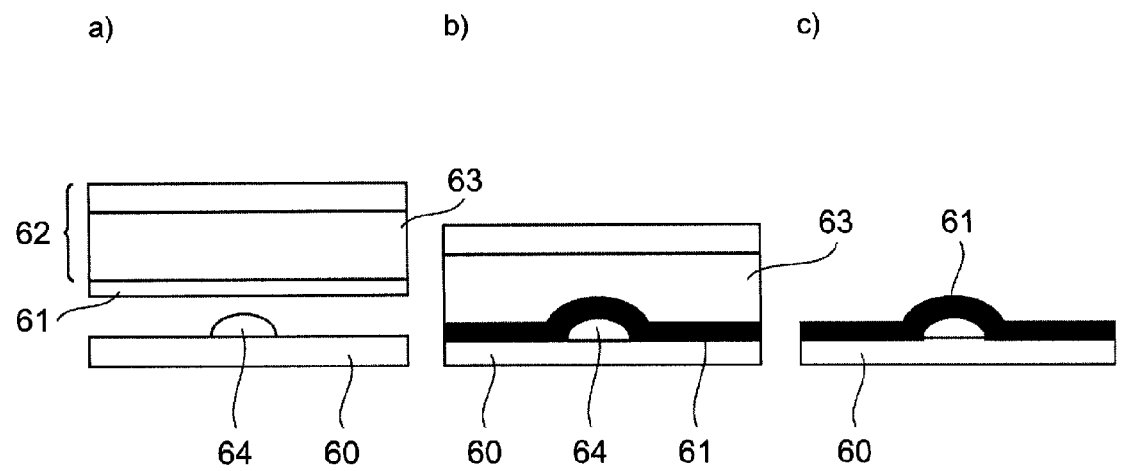
FIGS. 8a to 8c show process states of a method for producing a pre-stressed actuator with bistable behaviour.

As shown in the example illustrated in FIGS. 8a to 8c, stress layers can be fabricated using the process of FIGS. 7a to 7c for transferring a functional layer 61 onto an uneven topography of a receiver substrate 60. The layer 61 might be made from any material. The layer 61 is provided on a deformable layer 63 of a source substrate 62. As shown in FIG. 8b, after bonding the source substrate 62 in the receiver substrate 60, the material of the functional layer 61 is shaped by a protruding structure 64 of the receiver substrate 60. The shape of the protruding structure 64 is substantially arbitrary and in this embodiment it corresponds to an arch. After removing the material of the protruding structure 64 a pre-stressed layer has been obtained which can be used, for example, in actuators. The stress inside the membrane combined with the actuator shape induces a bistability. Examples for actuators are any materials where a stress can be induced and which can be actuated with electrostatic, electromagnetic, thermal or piezoelectric actuation in order to perform a bistable actuation behaviour due to the shape given by induced stress.

Figure 9:
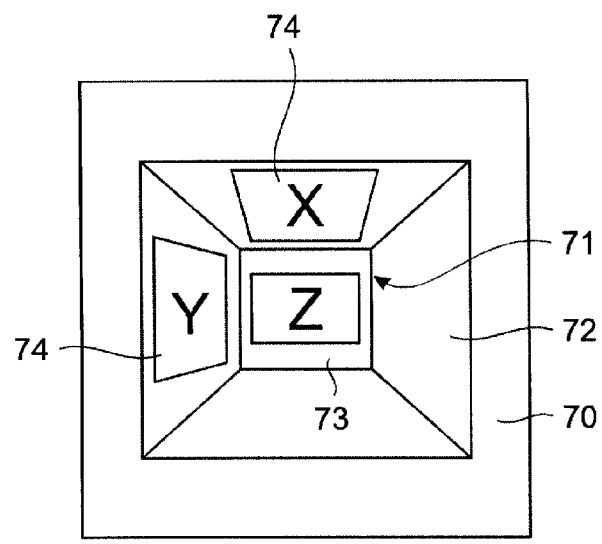
FIG. 9 shows a further embodiment of a device produced with the method for producing an integrated device which allows a 3D field measurement using magnetic sensors.

In FIG. 9 an example of a 3D magnetic field sensor is illustrated produced using the above described process. 3D field measurement (e.g. Hall sensors to measure magnetic vector) can be realized by transferring directional sensors on inclined surfaces having different orthogonal orientations. The different orientations of surface areas might be provided by a conical shape of a recess 71 in a receiver substrate 70 having tilted sidewalls 72 and a bottom plane 73 substantially parallel to the extension of a main surface of the receiver substrate 70.

The method of the present invention allows the combination of different and incompatible fabrication technologies in that a plurality of components can be stacked onto each other and/or on a substrate in a single process. This may work even if the components have to be applied on different levels of surfaces of the receiving substrate and even if a surface which receives a component is tilted with respect to the main surface of the receiving substrate. The method of the present invention allows the integration of heterogeneous devices such as RF MEMS, switches which are integrated on 3D RF waveguides, optical systems integration on SOC with VCSEL (III-V material), detectors (III-V material) and waveguides (silicon). Furthermore, the integration of chemical, physical sensors and actuators, valves and pumps, microchannels for in-situ measurements may be possible therewith.

An underlying idea of the present invention is to provide a deformable layer which is capable to absorb topography variations and follow topography differences when pressure is applied. The proposed solution is suitable not only for the transfer of micro-devices into cavities or recessed areas but allows also multiple transfers of the same or different devices in the same process onto surfaces of different topography levels, including non-planar surfaces and tilted surfaces.

We claim:

1. A method of producing an integrated device, comprising the steps of:
   providing a source substrate having a deformable layer on a surface thereof, wherein one or more components are carried on the deformable layer;
   providing a receiver surface having an uneven topography and having contact areas for receiving the one or more components;
   aligning the source substrate such that the one or more components are associated with the contact areas of the receiver surface;
   moving the source substrate and the receiver surface towards each other to establish contact between the one or more components and at least one contact area so that the deformable layer is at least partially deformed; and
   removing the source substrate such that the one or more components remain located on the contact areas of the receiver surface.

2. The method according to claim 1, further comprising the step of at least partially releasing the one or more of the components from the deformable layer before removing the source substrate.

3. The method according to claim 1, wherein the step of moving the source substrate toward the receiver surface is performed by applying a pressure to the source substrate and the receiver surface such that the deformable layer is at least partially deformed.

4. The method according to claim 1, further comprising the step of applying heat to at least the deformable layer before and/or during the step of moving the source substrate toward the receiver surface.

5. The method according to claim 1, wherein the contact areas are recessed or elevated with respect to a main surface of the receiver surface, and/or tilted with respect to a main surface of the receiver surface.

6. The method according to claim 1, wherein the source substrate carrying the components is formed by the steps of:
   providing the components on a surface of a substrate;
   applying an encapsulation material on the components to provide a plane surface;
   applying the deformable layer material on the plane surface; and
   removing the substrate and the encapsulation material between or besides the components such that the components are separately attached to the deformable layer.

7. The method according to claim 6, further comprising the step of: attaching a supporting substrate on a surface of the deformable layer opposing to the surface on which the components are placed.

8. The method according to claim 2, wherein the step of at least partially releasing the one or more components from the deformable layer is carried out by applying a selective laser ablation process by illuminating a contact region between the deformable layer and a component with laser light.

9. The method according to claim 1, further comprising the step of:
   providing adhesive means on the contact areas before the one or more components are brought into full contact with the contact areas, wherein the contact areas are adapted to fixate the one or more components at least against the removing of the source substrate.

* * * * *